US011764774B2

(12) United States Patent
Fabbro et al.

(10) Patent No.: US 11,764,774 B2
(45) Date of Patent: Sep. 19, 2023

(54) CHARGE REDISTRIBUTION FOR POWERING A DRIVEN SWITCH

(71) Applicant: Infineon Technologies Austria AG, Villach (AT)

(72) Inventors: Simone Fabbro, Udine (IT); Davide Giacomini, Valdenge (IT); Wolfgang Frank, Augsburg (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 17/580,386

(22) Filed: Jan. 20, 2022

(65) Prior Publication Data

US 2023/0231552 A1 Jul. 20, 2023

(51) Int. Cl.
*H03K 17/284* (2006.01)
(52) U.S. Cl.
CPC ................................. *H03K 17/284* (2013.01)
(58) Field of Classification Search
None
See application file for complete search history.

(56) References Cited

U.S. PATENT DOCUMENTS

| | | | | |
|---|---|---|---|---|
| 4,227,139 | A * | 10/1980 | Rosink | H02P 23/06 318/803 |
| 6,091,223 | A * | 7/2000 | Rogers | B60L 3/0069 320/128 |
| 10,530,477 | B2 * | 1/2020 | Nishino | H05B 45/382 |
| 10,763,840 | B1 * | 9/2020 | Tan | H03K 3/3565 |
| 2001/0054881 | A1 * | 12/2001 | Watanabe | H02M 3/33576 320/166 |
| 2015/0124517 | A1 * | 5/2015 | Keeth | G11C 13/00 365/148 |
| 2016/0149515 | A1 * | 5/2016 | Sicard | H03K 17/0406 327/109 |
| 2017/0188420 | A1 * | 6/2017 | Kido | H05B 47/24 |
| 2021/0282241 | A1 * | 9/2021 | Gao | H03K 5/1565 |

FOREIGN PATENT DOCUMENTS

CN 112421940 A 2/2021

OTHER PUBLICATIONS

Hemal Shah, et al., "From Planar to Trench—Evaluation of Ruggedness across Various Generations of Power MOSFETs and Implications on In-circuit Performance", Conference: Applied Power Electronics Conference and Exposition (APEC), 2011, Twenty-Sixth Annual.
Michael F. Thompson, "Application Note AN-1155—Linear Mode Operation of Radiation Hardened MOSFETs", Aug. 2010, pp. 1-11.
European Patent Office; Extended European Search Report Corresponding to Related Application No. 2315175.2-1211; dated May 25, 2023; 8 Pgs.

* cited by examiner

*Primary Examiner* — Daniel C Puentes
*Assistant Examiner* — Khareem E Almo
(74) *Attorney, Agent, or Firm* — Cooper Legal Group LLC (57) ABSTRACT

An apparatus comprises a power source connected to a buffer capacitor. The apparatus comprises a first switch connected between the buffer capacitor and a driven switch. The buffer capacitor is charged by the power source when the first switch is turned off. The apparatus comprises a comparator. The comparator monitors the charging of the buffer capacitor. In response to the buffer capacitor reaching a threshold amount of charge, the comparator turns on the first switch to initiate a charge redistribution of charge from the buffer capacitor to the driven switch.

20 Claims, 9 Drawing Sheets

CHARGE REDISTRIBUTION FOR POWERING A DRIVEN SWITCH

TECHNICAL FIELD

The present disclosure relates to the field of providing power transfer, gate drive, thyristors, and solid state switches.

BACKGROUND

Various types of devices may utilize driven switches, such as solid state driven switches, thyristors, or other types of switches. A driven switch may be turned on or off based upon energy applied to a gate of the driven switch or to a control terminal of a thyristor. The driven switch may have a particular safe operating area corresponding to voltage and current conditions at which the driven switch can operate without self-damage, which can be affected by how quickly the driven switch is turned on. The driven switch could be damaged by a high inrush current based on load and/or from the driven switch being turned on too slowly. When a device has a relatively weak power source (e.g., a voltage source of about 15 volts or some other low voltage), the power from the weak power source may not be capable of turning the driven switch on fast enough in order to avoid damaging the driven switch.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an apparatus is provided. The apparatus comprises a power source. A first switch is connected between a buffer capacitor and a driven switch. The buffer capacitor is connected to and charged by the power source when the first switch is turned off. A comparator monitors the charging of the buffer capacitor. In response to the buffer capacitor reaching a threshold amount of charge, the comparator turns on the first switch to initiate a charge redistribution of charge from the buffer capacitor to the driven switch.

In an embodiment of the techniques presented herein, an apparatus is provided. The apparatus comprises a first switch connected between a buffer capacitor and a driven switch. The buffer capacitor is charged by a power source when the first switch is turned off. A second switch operably connects and disconnects the buffer capacitor from the power source. A comparator monitors the charging of the buffer capacitor while the second switch is turned on and the first switch is turned off. In response to the buffer capacitor reaching a threshold amount of charge, the comparator turns on the first switch to initiate a charge redistribution of charge from the buffer capacitor to the driven switch.

In an embodiment of the techniques presented herein, a method is provided. The method includes opening a first switch connecting a buffer capacitor to the driven switch. A second switch connecting the buffer capacitor to a power source is closed. The power source is turned on to charge the buffer capacitor while the first switch is open and the second switch is closed. A comparator monitors the charging of the buffer capacitor to determine whether a threshold has been reached. In response to the threshold being reached, the comparator closes the first switch to initiate a charge redistribution of charge from the buffer capacitor to the driven switch.

In an embodiment of the techniques presented herein, an apparatus is provided. The apparatus includes a means for opening a first switch connecting a buffer capacitor to the driven switch. The apparatus includes a means for closing a second switch connecting the buffer capacitor to a power source. The apparatus includes a means for turning on the power source to charge the buffer capacitor while the first switch is open and the second switch is closed. The apparatus includes a means for monitoring, by a comparator, the charging of the buffer capacitor to determine whether a threshold has been reached. The apparatus includes a means for in response to the threshold being reached, closing the first switch to initiate a charge redistribution of charge from the buffer capacitor to the driven switch.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

Within the field of electronics, an apparatus comprises a driven switch, such as a solid state switch or a thyristor, which is to be controlled within a safe operating area of the driven switch. The safe operating area of the driven switch corresponds to voltage and current characteristics under which the driven switch can safely operate without being damaged. Safely operating the driven switch can be problematic where energy sourcing capabilities of the apparatus for controlling the driven switch (e.g., controlling a gate of a solid state switch, powering a control terminal of a thyristor, etc.) is limited such as due to a weak power source. In some embodiments, the weak power source may have a nominal voltage such as around 15 volts, 16 volts, or some other voltage. The limited amount of energy being transferred by the weak power source to the driven switch can result in a long turn on phase of the driven switch, which can damage the driven switch. Thus, the shorter the turn on phase for the driven switch, the lower the risk of damaging or destroying the driven switch.

A dedicated gate driver may be used to control the gate of a driven switch in a safe manner where the gate is driven high only when an energy supply has reached a sufficient level. This requires the generation of a control signal that is coupled to the input of the gate driver. The control signal is used to determine the activation of the driven switch. Besides requiring the control signal, the gate driver may require the generation of a strong power supply just for the gate driver. Thus, the use of a dedicated gate driver is not a desirable solution. Another solution relates to the use of isolated or non-isolated power sources that provide enough current to charge the gate fast enough that the driven switch is not damaged. Similar to the dedicated gate driver, this solution requires additional power sources, and thus is not desirable.

The techniques provided herein are capable of safely controlling driven switches such as solid state driven switches (e.g., SI or SiC metal-oxide-semiconductor field-effect transistors (MOSFETs), insulated-gate bipolar transistors (IGBTs), etc.) and/or thyristors in devices where the power source does not provide enough energy to safely turn on the driven switch in a timely manner without potentially damaging the driven switch. In particular, a charge storage element, such as a buffer capacitor, may be charged by the power source up to a threshold level before at least some of the charge of the charge storage element is redistributed. The charge redistribution is performed through one or more switches (e.g., a low ohmic controlled switch) connecting the charge storage element to the driven switch. The charge redistribution from the charge storage element increases the speed at which driven switch is turned on so that the driven switch is turned on fast enough so that the driven switch is not otherwise damaged.

In some embodiments of safely turning on a driven switch of an apparatus, the apparatus comprises a power source configured to provide energy to the apparatus for driving the driven switch. The power source (e.g., a voltage source with a nominal voltage such as 15 volts, 16 volts, or some other voltage) alone may not provide enough energy to safely turn the driven switch on in a timely manner. Accordingly, the apparatus comprises a first switch connecting a buffer capacitor (a charge storage element) to the driven switch, such as to a gate of the driven switch or to a control terminal of a thyristor. In some embodiments, the buffer capacitor is sized between 4 to 5 times a gate capacitance of the driven switch, such as sized within a range from several hundreds of pF to a few hundreds of nF. The buffer capacitor is connected to the power source and is charged by the power source when the first switch is turned off. The apparatus comprises a comparator that monitors the charging of the buffer capacitor in relation to a threshold. In some embodiments, the voltage Vcbuf across the buffer capacitor at the comparator decision point ensures that right after charge redistribution, the voltage level at the gate Vgate=Cgate/(Cbuf+Cgate)*Vcbuf is larger than a critical Vgate_crit voltage level determined according to the switch SOA. Since Vgate_crit, Cgate, Cbuf are known parameters, then Vcbuf threshold can be determined. Cgate may be adjusted, but in general Cgate=f(Vgate).

When the comparator determines that the buffer capacitor has reached a threshold amount of charge for safely turning on the driven switch (e.g., driving the gate of the driven switch), the first switch is turned on to initiate a charge redistribution from the buffer capacitor to the driven switch for safely turning on the driven switch fast enough that the driven switch is not damaged. The comparator may determine that the buffer capacitor has reached the threshold amount of charge by comparing a voltage across the buffer capacitor with a reference voltage. In response to the comparator determining that the voltage across the buffer capacitor has reached the level of the reference voltage, then the comparator turns on the first switch to initiate the charge redistribution to turn on the driven switch (e.g., charge the gate of the driven switch).

In some embodiments, the apparatus includes a second switch. The second switch is controlled to disconnect the buffer capacitor from the power source at a particular point in time after the first switch is closed and the charge redistribution has been initiated and carried out until transient settling. The second switch disconnects the buffer capacitor after a delay (e.g., delay in the μs range) from when the charge redistribution is initiated. The delay corresponds to a time period of the charge redistribution where the charge redistribution can adequately charge the gate of the driven switch or adequately transfer current to the control terminal of the thyristor for turning the driven switch on in a timely manner. In this way, the second switch is opened to disconnect the buffer capacitor from the power source so that the buffer capacitor is not needlessly charged in parallel to the driven switch by the power source.

Figure 1A:
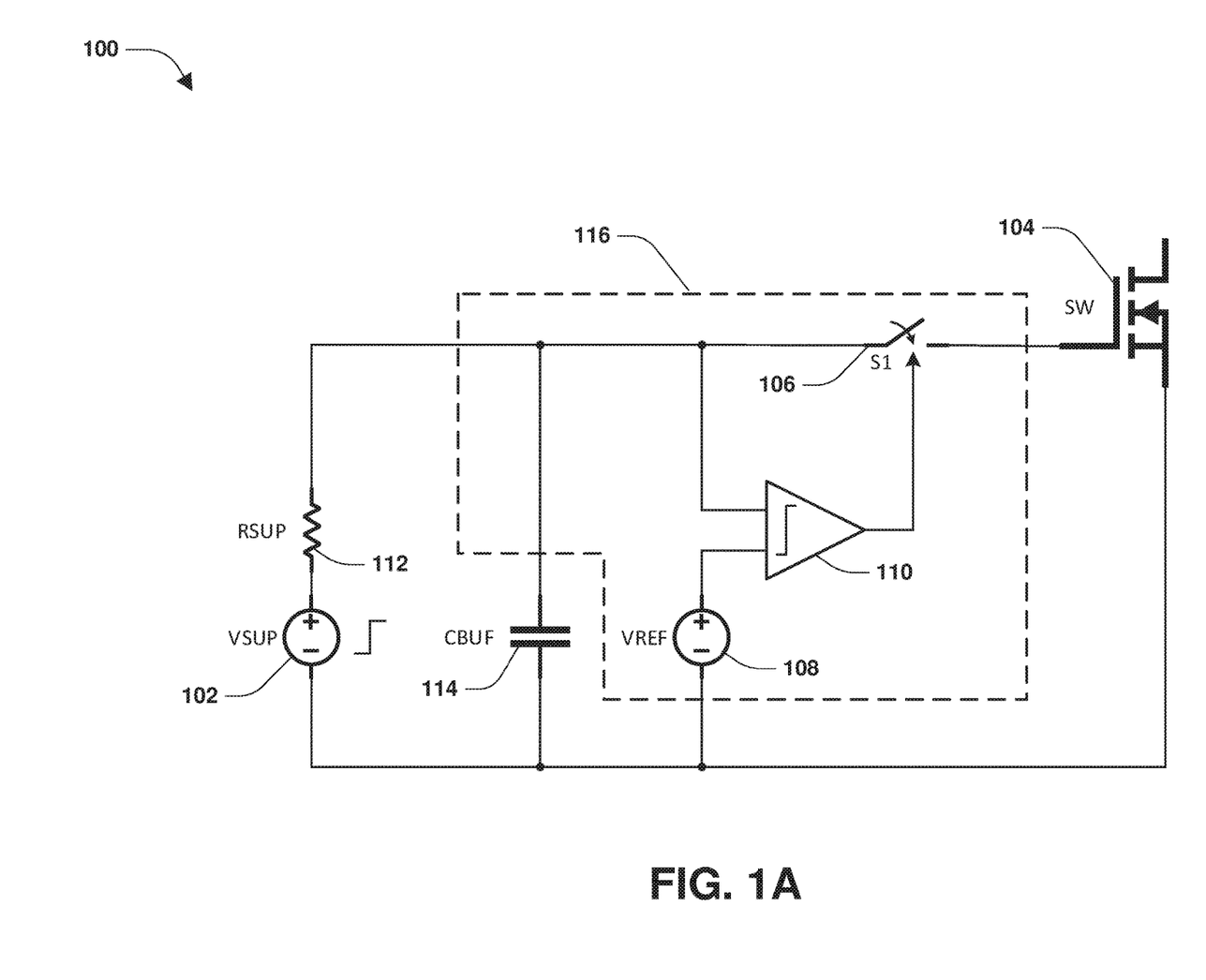
FIG. 1A is a component block diagram illustrating an apparatus for powering a driven switch in accordance with at least some of the techniques presented herein.

FIG. 1 illustrates an embodiment of an apparatus 100 comprising a driven switch 104. The apparatus 100 comprises a power source VSUP 102 (e.g., a voltage source or some other power/energy source) with an associated equivalent power source resistance RSUP 112 having a resistance in the mega ohm range. The power source VSUP 102 (e.g., a 15V voltage power source, a 16V voltage power source, or other power source with some other voltage) may be a relatively weak power source due to the equivalent power source resistance RSUP 112. That is, the equivalent power source resistance RSUP 112 may be relatively high, which reduces the power output by the power source VSUP 102. The power source VSUP 102, combined with the equivalent power source resistance RSUP 112, may not provide enough energy to drive a gate of the driven switch 104 fast enough so that the driven switch 104 does not incur damage from the driven switch 104 being turned on too slowly. To improve the turn on time of the driven switch 104, the apparatus 100 includes a buffer capacitor 114 that is used as a charge storage element. The apparatus 100 comprises a first switch S1 106 connected between the buffer capacitor 114 and the driven switch 104.

In some embodiments, the power source VSUP 102 and the equivalent power source resistance RSUP 112 may be located on an input chip of a gate driver, and remaining components (circuitry) of apparatus 100 may be located on an output chip of the gate driver. In this embodiment, the power source VSUP 102 couples to the remaining components of apparatus 100 via an isolation barrier for charging the buffer capacitor 114. A latch 109, illustrated and discussed in conjunction with FIG. 10, may be reset by decoupling the power source VSUP 102 from the remaining components of apparatus 100.

The buffer capacitor 114 is connected to and is charged by the power source VSUP 102 when the first switch S1 106 is turned off. The apparatus 100 comprises a comparator 110 that monitors the charging of the buffer capacitor 114 by the power source VSUP 102 when the first switch S1 106 is turned off. For example, the comparator 110 may compare a voltage across the buffer capacitor 114 with a reference voltage VREF 108. In response to the comparator 110 determining that the voltage across the buffer capacitor 114 has reached the level of the reference voltage VREF 108, then the comparator 110 turns on the first switch S1 106 in order to connect the buffer capacitor 114 to the driven switch 104. The first switch S1 106 is turned on to initiate a charge redistribution of charge from the buffer capacitor 114 to the gate of the driven switch 104 or to a control terminal of a thyristor in order to turn it on. In this way, the buffer capacitor 114 transfers charge during the charge redistribution to be added to the driven switch 104 (e.g., transfer charge to an equivalent gate capacitance of the driven switch 104) for operating the driven switch 104. The driven switch 104 is turned on fast enough for safe operation of the driven switch 104 because the charge redistribution provides additional charge, in addition to that of the power source VSUP 102, to the driven switch 104 in comparison to if only the power source VSUP 102 was used for supplying energy to the driven switch 104. In some embodiments where the driven switch 104 is a thyristor, the charge redistribution transfers charge current to a control terminal of the thyristor to control the thyristor.

Figure 1B:
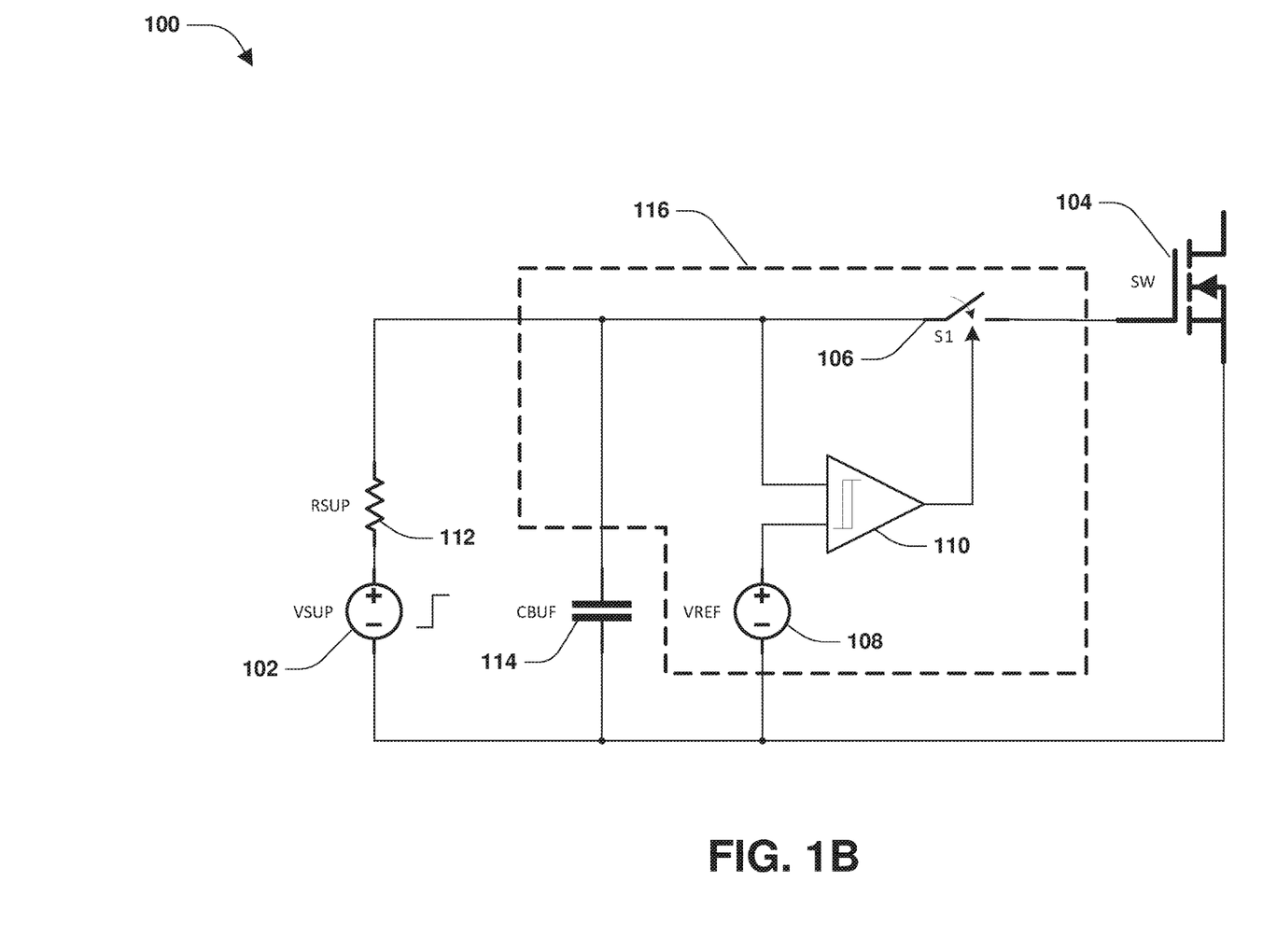
FIG. 1B is a component block diagram illustrating an apparatus for powering a driven switch in accordance with at least some of the techniques presented herein.
Figure 1C:
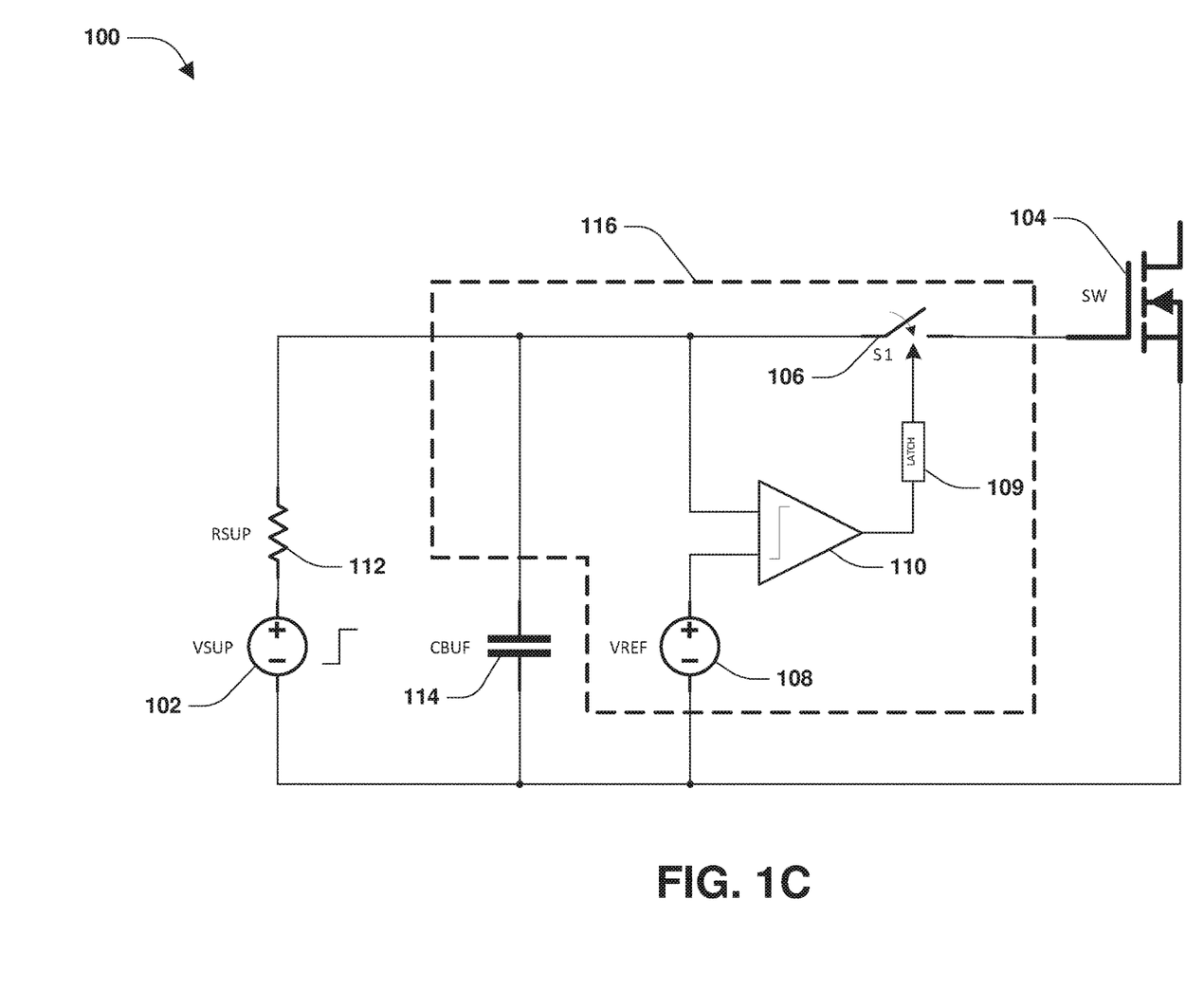
FIG. 1C is a component block diagram illustrating an apparatus for powering a driven switch in accordance with at least some of the techniques presented herein.

FIG. 1B illustrates hysteresis functionality built into the comparator 110. The hysteresis functionality may be set so that Vhsyt_high>Vhsyt_low, where Vhsyt_high is the threshold of Vcbuf at which S1 106 is closed and Vhsyt_low is the threshold of Vcbuf at which S1 106 is open. The hysteresis functionality is implemented such that the switch S1 106 is closed if Vcbuf>Vhyst_high and opened again if Vcbuf<Vhyst_low or the power source VSUP is disconnected. FIG. 10 illustrates a latch 109 connected to the output of the comparator 110. The latch 109 is operated such that when the first switch S1 106 is closed, the first switch S1 106 remains closed until the power source VSUP 102 is disconnected. The latch 109 is only reset once the power source VSUP 102 is disconnected.

In some embodiments, the comparator 110, the first switch 106, and/or the reference voltage VREF 108 may be implemented as an integrated circuit, illustrated by dashed line 116. In some embodiments, the buffer capacitor 114 may be dimensioned such that after the charge redistribution of charge from the buffer capacitor 114 to the driven switch 104, a drive voltage at the driven switch may be higher than a critical level.

FIG. 2 illustrates an embodiment of an apparatus 200 comprising a driven switch 204. The apparatus 200 comprises a power source VSUP 202 with an associated equivalent power source resistance RSUP 212 having a resistance in the mega ohm range. The power source VSUP 202 (e.g., a 15V voltage power source, a 16V voltage power source, or other power source with some other voltage) may be a relatively weak power source due to the equivalent power source resistance RSUP 212. The power source VSUP 202, combined with the equivalent power source resistance 212, may not provide enough energy to control such as open the driven switch 204 fast enough so that the driven switch 204 does not incur damage from the driven switch 204 being turned on too slowly. To improve the turn on time of the driven switch 204, the apparatus 200 includes a buffer capacitor 214 that is used as a charge storage element. The apparatus 200 comprises a first switch S1 206 connected between the buffer capacitor 214 and the driven switch 204. The apparatus 200 comprises a second switch S2 222 that operably connects and disconnects the buffer capacitor 214 from the power source VSUP 202.

Figure 2A:
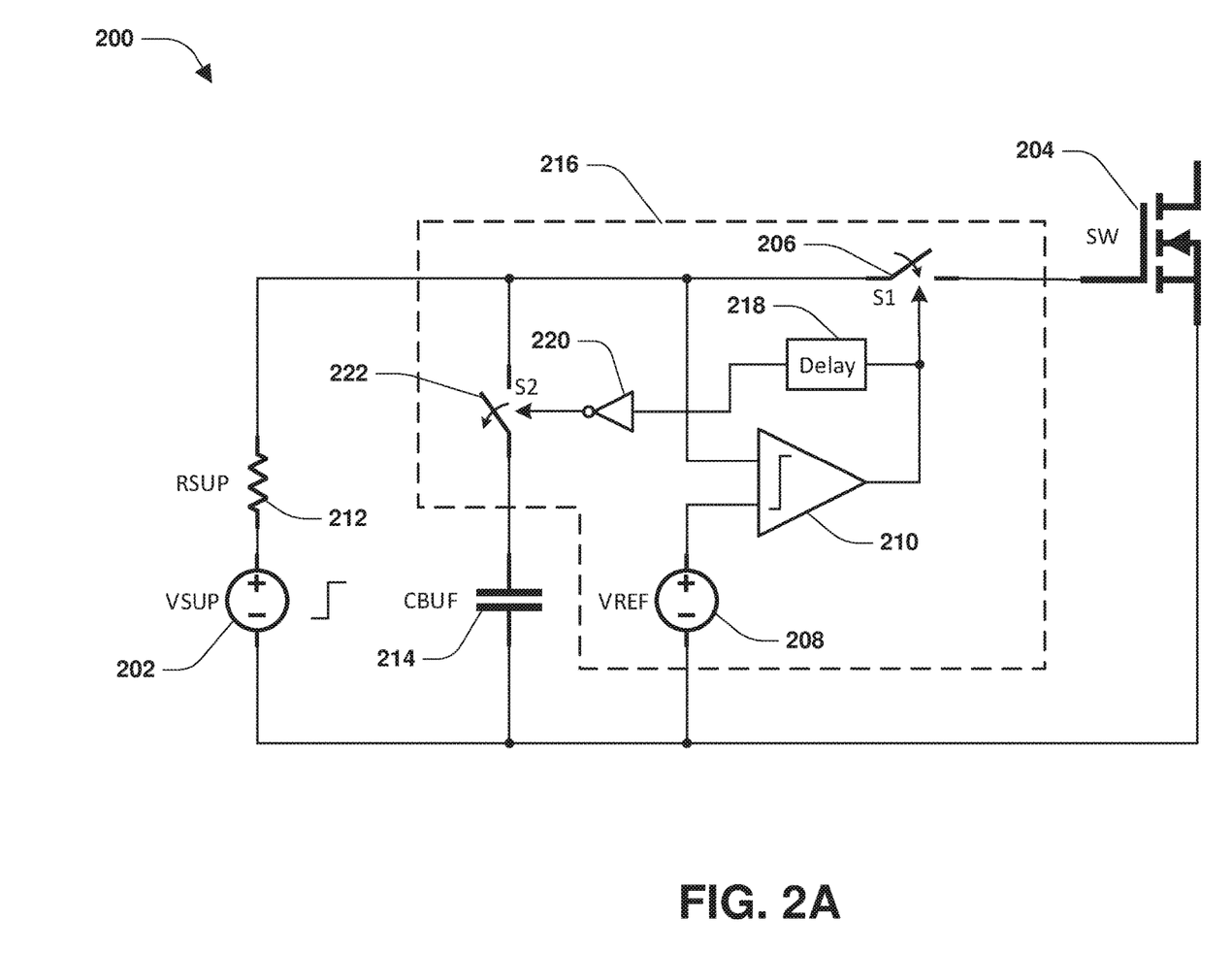
FIG. 2A is a component block diagram illustrating an apparatus for powering a driven switch in accordance with at least some of the techniques presented herein.

The buffer capacitor 214 is connected to and is charged by the power source VSUP 202 when the first switch S1 206 is turned off and the second switch S2 222 is turned on. In some embodiments, a comparator 210 turns on the second switch S2 222 and turns off the first switch S1 206 in order to connect the buffer capacitor 214 to the power source VSUP 202. The buffer capacitor 214 is connected to the power source VSUP 202 so that the power source VSUP 202 can charge the buffer capacitor 214. The comparator 210 monitors the charging of the buffer capacitor 214 by the power source VSUP 202 when the first switch S1 206 is turned off and the second switch S2 222 is turned on. For example, the comparator 210 may compare a voltage across the buffer capacitor 214 with a reference voltage VREF 208. In response to the comparator 210 determining that the voltage across the buffer capacitor 214 has reached the level of the reference voltage VREF 208, then the comparator 210 turns on the first switch S1 206 and/or turns off the second switch S2 222.

The first switch S1 206 and/or the second switch S2 222 are both turned and kept on for a time duration which is sufficient to initiate and carry on a charge redistribution from the buffer capacitor 214 to the driven switch 204 in order to turn on the driven switch 204. In this way, the buffer capacitor 214 transfers charge during the charge redistribution to the driven switch 204 (e.g., transfer charge to an equivalent gate capacitance of the driven switch 204) for operating the driven switch 204. The driven switch 204 is turned on fast enough for safe operation of the driven switch 204 because the charge redistribution provides additional charge, in addition to that of the power source VSUP 202, to the driven switch 204 in comparison to if only the power source VSUP 202 was used for supplying energy to the driven switch 204.

The comparator 210 may turn off the second switch S2 222, such as through a logic inverter 220, after a delay 218 (a delay implemented by delay circuitry) from a point in time when the first switch S1 206 was turned on to initiate the charge redistribution. If the switch control for the first switch S1 206 and the second switch S2 222 is active high, then the logic inverter 220 provides inverted control signals to the first switch S1 206 and the second switch S2 222. In some embodiments, the delay 218 may correspond to a timeframe for the charge redistribution to charge an equivalent gate capacitance of the gate of the driven switch 204 or to transfer current to the control terminal of the thyristor for operating, such as turning on, the driven switch 204. The second switch S2 222 is turned off, such as after the charge redistribution has settled, by the comparator 210 in order to disconnect the buffer capacitor 214 from the power source VSUP 202. In this way, energy from the power source VSUP 202 is not wasted in charging the buffer capacitor 214 after the equivalent gate capacitance or the control terminal has been charged by the buffer capacitor 214.

The comparator 210 may turn off the second switch 222 after a timespan. The timespan may correspond to a time for the charge redistribution to charge the gate of the driven switch 204 (e.g., charge the equivalent gate capacitance of the driven switch 204) for operating the driven switch 204 such as to turn on the driven switch 204. Once the charge redistribution between the buffer capacitor 214 and the switch gate capacitance has settled (the timespan has occurred), the comparator 210 turns off the second switch 222 in order to disconnect the buffer capacitor 214 from the driven switch 204.

In some embodiments, the comparator 210, the first switch S1 206, the second switch S2 222, the logic inverter 220, the delay 218 (delay circuitry), and/or the reference voltage VREF 208 may be implemented as an integrated circuit, illustrated by dashed line 216. In some embodiments, the buffer capacitor 214 may be dimensioned such that after the charge redistribution of charge from the buffer capacitor 214 to the driven switch 204, a drive voltage at the driven switch may be higher than a critical level.

Figure 2B:
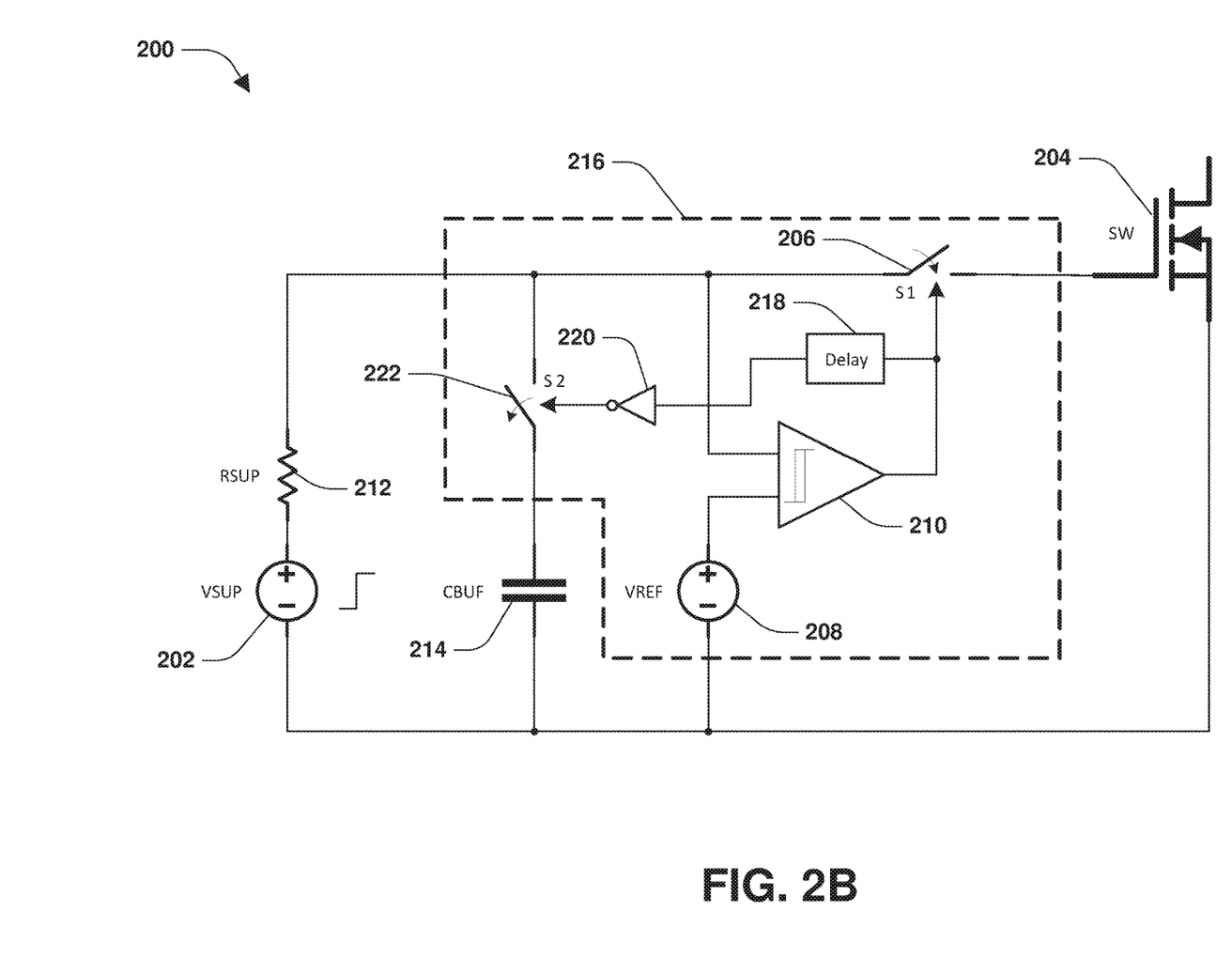
FIG. 2B is a component block diagram illustrating an apparatus for powering a driven switch in accordance with at least some of the techniques presented herein.
Figure 2C:
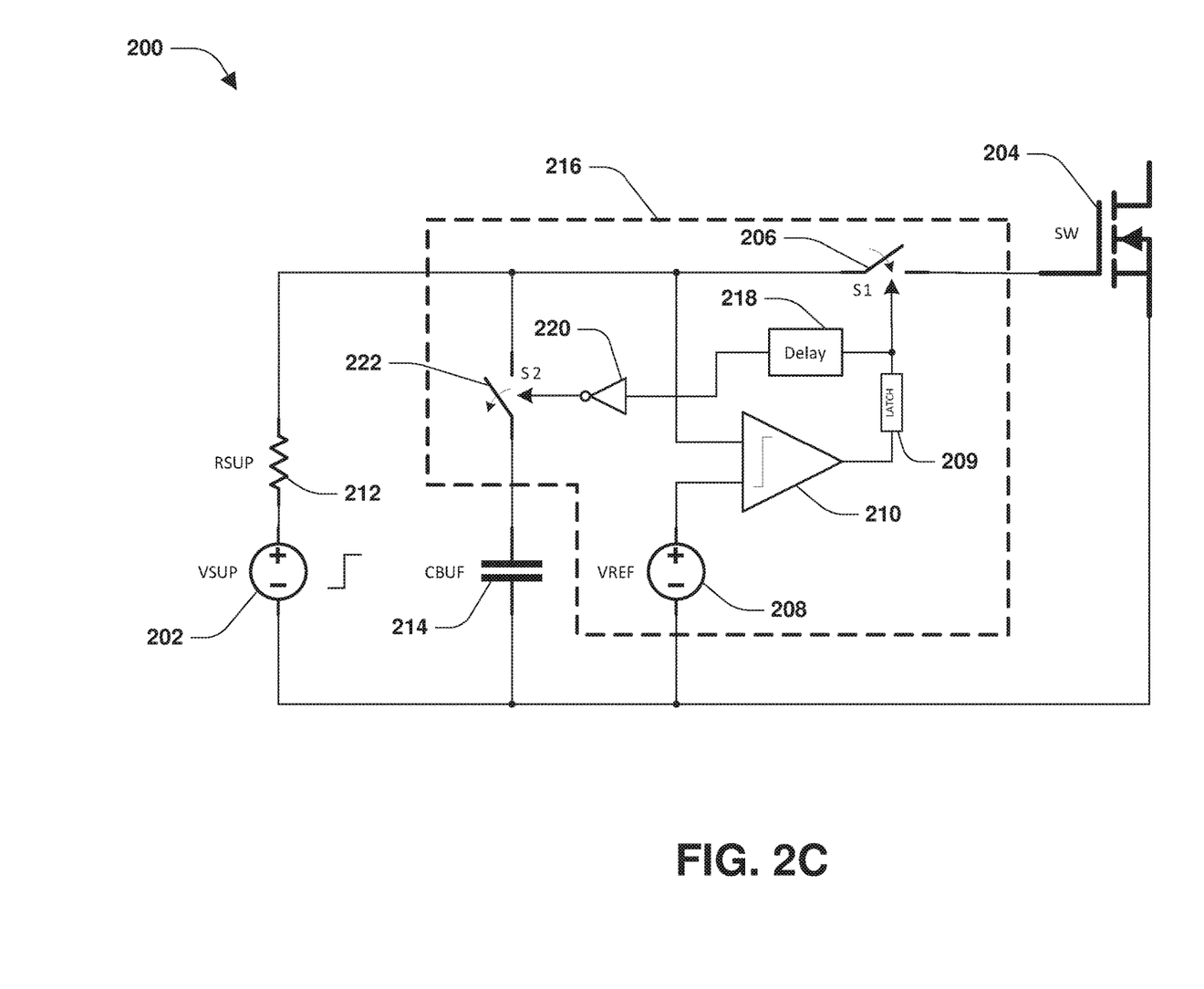
FIG. 2C is a component block diagram illustrating an apparatus for powering a driven switch in accordance with at least some of the techniques presented herein.
Figure 2D:
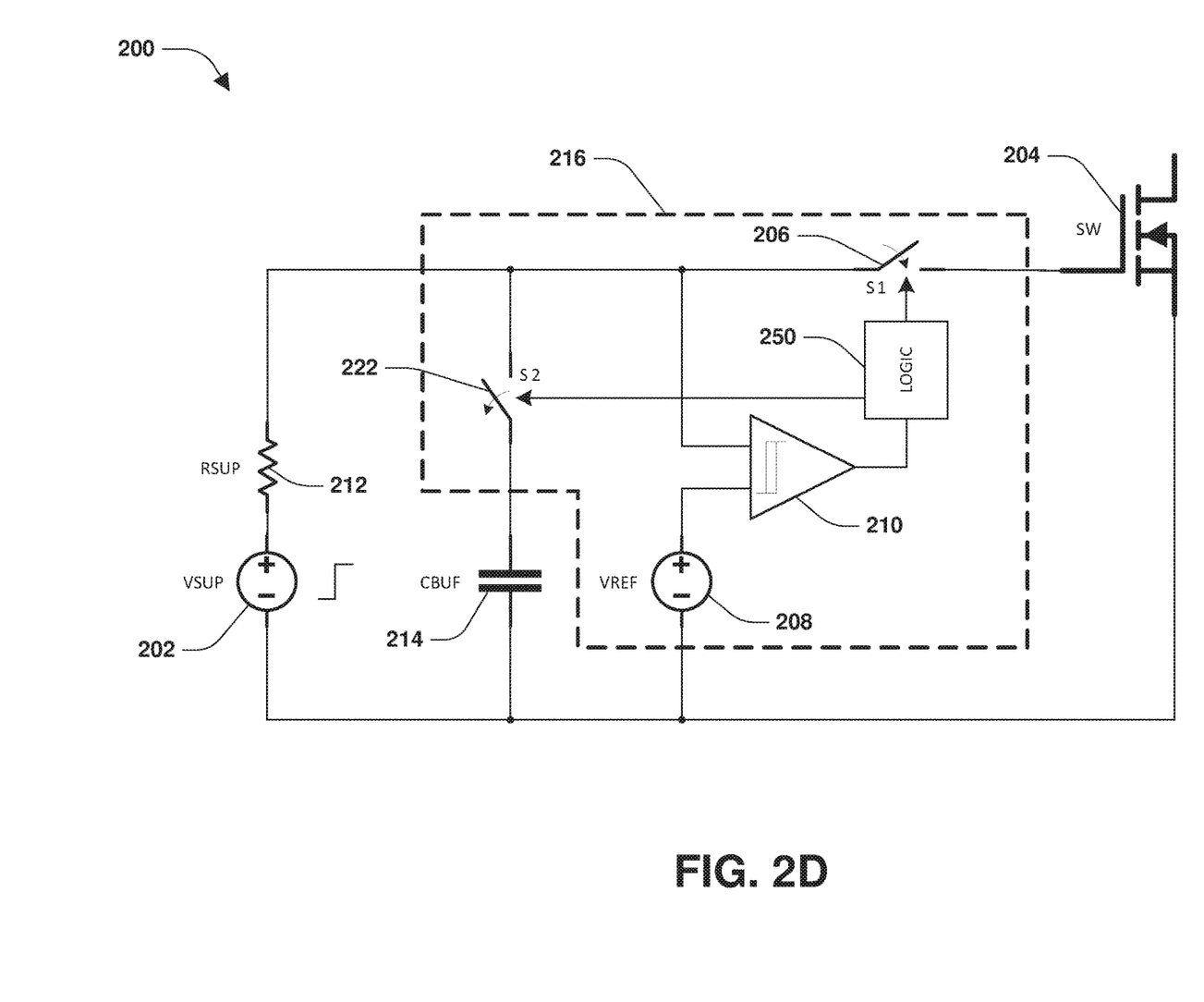
FIG. 2D is a component block diagram illustrating an apparatus for powering a driven switch in accordance with at least some of the techniques presented herein.

FIG. 2B illustrates hysteresis functionality built into the comparator 210. The hysteresis functionality may be set so that Vhsyt_high>Vhsyt_low, where Vhsyt_high is the threshold of Vcbuf at which S1 206 is closed and Vhsyt_low is the threshold of Vcbuf at which S1 206 is open. The hysteresis functionality is implemented such that the switch S1 206 is closed if Vcbuf>Vhyst_high and opened again if Vcbuf<Vhyst_low or the power source VSUP is disconnected. FIG. 2C illustrates a latch 209 connected to the output of the comparator 210. The latch 209 is operated such that when the first switch S1 206 is closed, the first switch S1 206 remains closed until the power source VSUP 202 is disconnected. The latch 209 is only reset once the power source VSUP 202 is disconnected. FIG. 2D illustrates a logic block 250 connected between the output of the comparator 210 and the first switch S1 206 and the second switch S2 222. In this embodiment, the logic block 250 is connected to the output of the comparator 210 (with or without hysteresis) in order to allow full charge redistribution settling after closing the first switch S1 206 and before opening the second switch S2 222. After closing the first switch S1 206, whose closed status is ensured by the latch 209 (e.g., latch of logic block 250) or by the hysteresis functionality, the opening of the second switch S2 222 can be determined based on a sufficient delay or on a different voltage level VGATE_SW>VHYST_HIGH. Moreover, if the first switch S1 206 is latched ON, the second switch S2 222 may be closed (and possibly latched) again if a sufficient voltage VGATE_SW>VHYST_HIGH is reached.

Figure 3:
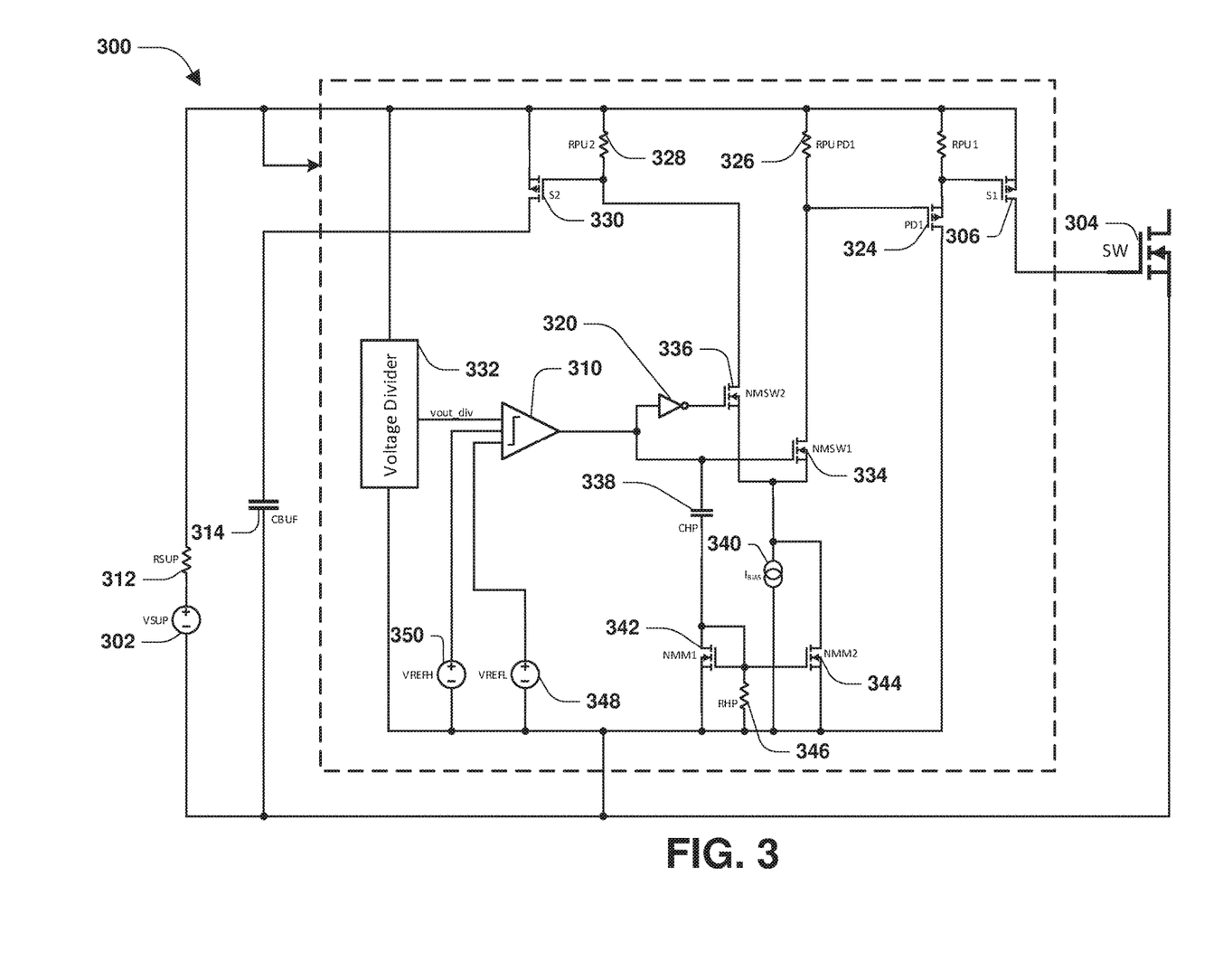
FIG. 3 is a component block diagram illustrating an apparatus for powering a driven switch in accordance with at least some of the techniques presented herein.

FIG. 3 illustrates an apparatus 300 comprising a driven switch 304. The apparatus 300 comprises a power source VSUP 302 with an associated equivalent power source resistance RSUP 312 having a resistance in a mega ohm range. The power source VSUP 302 alone may not provide enough energy to operate the driven switch 304 fast enough so that the driven switch 304 does not incur damage from the driven switch 304 being turned on too slowly. To improve the turn on time of the driven switch 304, the apparatus 300 includes a buffer capacitor 314 that is used as a charge storage element. The apparatus 300 comprises a switch S1 306 connected between the buffer capacitor 314 and the driven switch 304. The apparatus 300 comprises a switch S2 330 that operably connects and disconnects the buffer capacitor 314 from the power source VSUP 302.

The apparatus 300 comprises a first current steering switch NMSW1 334 and a second current steering switch NMSW2 336. The first current steering switch NMSW1 334 and the second current steering switch NMSW2 336 may be controlled to steer current IBIAS 340 either in a first direction to turn on the switch S1 306 or in a second direction to turn on the switch S2 330. A comparator 310 is configured to control the first current steering switch NMSW1 334 and the second current steering switch NMSW2 336 for steering the current IBIAS 340, such as where the switch S1 306 is turned on during a first timespan and the switch S2 330 is turned off during a second timespan longer than the first timespan.

In some embodiments, the apparatus 300 comprises a voltage divider 332 (or a signal conditioning block) located between an input of the comparator 310 and power source VSUP 202. In some embodiments, the comparator 310 may comprise a hysteretic comparator that uses a first voltage reference 350 and a second voltage reference 348 to set a hysteresis, as illustrated by FIG. 3. It may be appreciated that other types of comparators may also be utilized.

Before the comparator 310 detects a voltage threshold at the buffer capacitor 314, an output voltage level of the comparator 310 is low so that the second current steering switch NMSW2 336 is closed. The current IBIAS 340 is steered by a logic inverter 320 through the second current steering switch NMSW2 336 to RPU2 328 so that the switch S2 330 is turned on. Since the power source VSUP 302 may be relatively weak, a voltage rise across the buffer capacitor 314 is expected to be slow and the turn on time of switch S2 330 is not a limited factor, in some embodiments. Hence the current IBIAS 340 consumed to turn on the switch S2 330 on through RPU2 328 can be low and RPU2 328 can be relatively high ohmic. In some embodiments, a low biasing current and low power building blocks may be desired since the weak power source VSUP 302 may be the only power source in the apparatus 300 that can be used for supplying energy to the low power building blocks of the apparatus 300. Otherwise, if the low power building blocks required a high current, then the voltage drop across the equivalent power source resistance RSUP 312 may be high and the settling voltage for the gate drive may be insufficient.

If the comparator 310 detects the voltage threshold, the current IBIAS 340 is steered away from RPU2 328 and is steered towards RPUPD1 326 by closing the first current steering switch NMSW1 334 and opening the second current steering switch NMSW2 336. While RPU2 328 slowly discharges the gate of switch S2 330, switch PD1 324 quickly charges the gate of switch S1 306, so that the charge redistribution between the buffer capacitor 314 and the driven switch 304 can occur through switch S2 330 not yet turned off, and thus switch S1 306 may be quickly turned on. The turn on speed of switch S1 306 can be optionally further increased by injecting a time limited current pulse towards RPUPD1 326. In some embodiments, this may be achieved by coupling the rising voltage at the output of the comparator 310 through the capacitor CHP 338 to a current mirror consisting of N-type metal-oxide-semiconductors (NMOS) es NMM1 342, NMM2 344, and resistor RHP 346, with the capacitor CHP 338 and the resistor RHP 346 forming a high pass filter. The duration of this current pulse is determined by a time constant set by the capacitor CHP 338 and the resistor RHP 346, which is set to be short enough that the necessary charge to drive the gate of PD1 324 is also just instantaneously taken from the buffer capacitor 314 and not from the weak power source VSUP 302. The parallel charging of buffer capacitor 314 and the gate of the driven switch 304 continues until RPU2 328 pulls the driving voltage at the gate of switch S2 330 below its threshold voltage. At that point, the switch S2 330 is off and the buffer capacitor 314 is disconnected from the gate of the driven switch 304. Thus, the weak power source VSUP 302 is merely charging the gate of the driven switch 304 and not the buffer capacitor 314.

Figure 4:
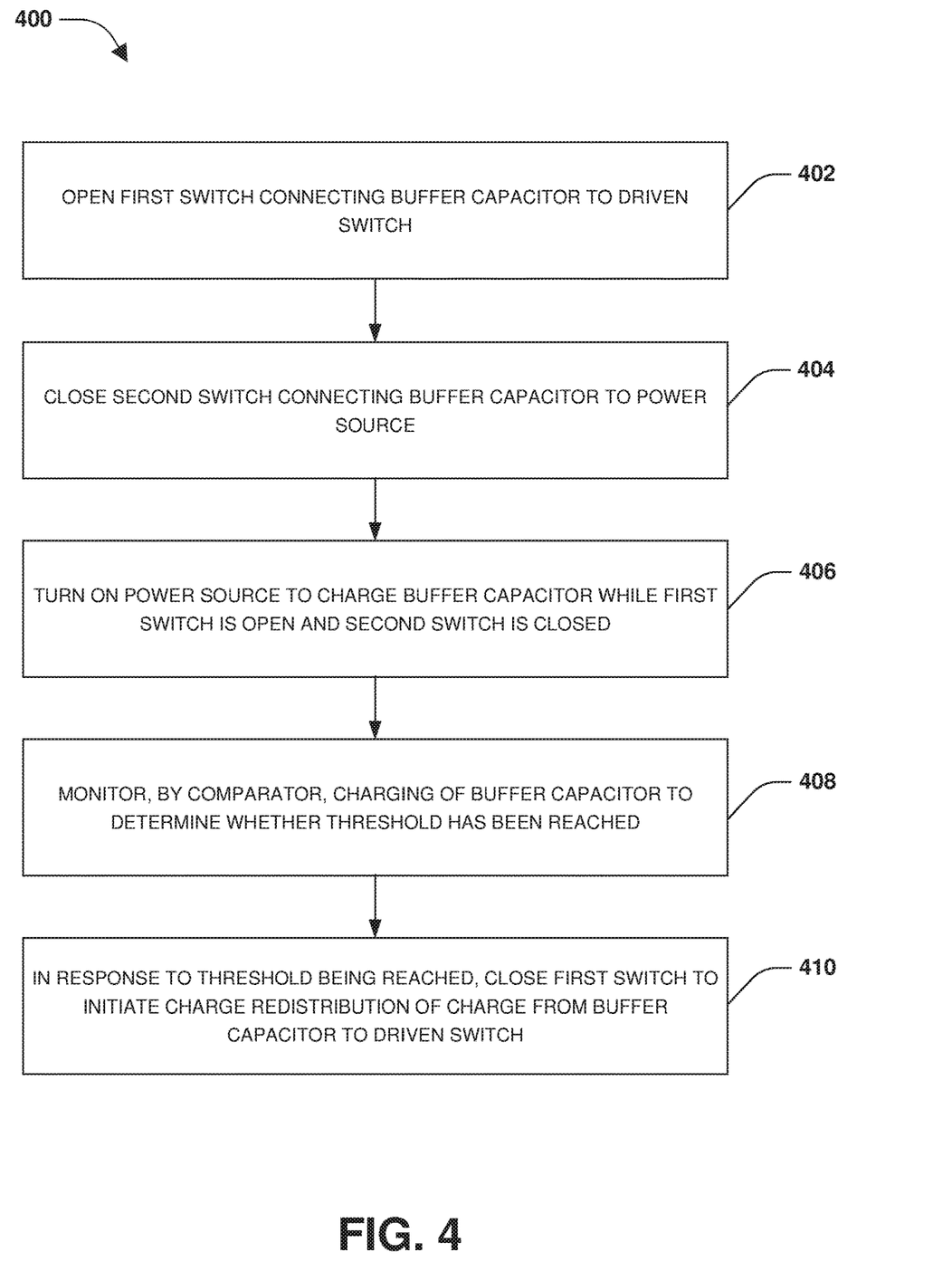
FIG. 4 is an illustration of an example method of powering a driven switch accordance with at least some of the techniques presented herein.

FIG. 4 illustrates a method 400 for powering a gate of a driven switch, which is described in conjunction with the apparatus 200 of FIG. 2 for illustrative purposes. In some embodiments, the method 400 is performed to control the driven switch 204 through the operation of the comparator 210, the first switch S1 206, and the second switch 222 so that the buffer capacitor 214 performs a charge redistribution to transfer charge from the buffer capacitor 214 to the driven switch 204.

In some embodiments, the first switch 206 may be initially closed to connect the buffer capacitor 214 to the driven switch 204. In some embodiments, the second switch 222 may be initially open to disconnect the buffer capacitor 214 from the power source VSUP 202. During operation 402 of method 400, the first switch 206 is opened in order to disconnect the buffer capacitor 214 from the driven switch 204. In some embodiments, the first switch 206 is opened (turned off) by the comparator 210 based upon a determination that the buffer capacitor 214 is to be charged by the power source VSUP 202. During operation 404 of method 400, the second switch 222 is closed in order to connect the buffer capacitor 214 to the power source VSUP 202. In some embodiments, the second switch 222 is closed (turned on) by the comparator 210 based upon the determination that the buffer capacitor 214 is to be charged by the power source VSUP 202.

During operation 406 of method 400, the power source VSUP 202 is turned on to charge the buffer capacitor 214 while the first switch 206 is opened (off) and the second switch 222 is closed (on). During operation 408 of method 400, the comparator 210 monitors the charging of the buffer capacitor 214 by the power source VSUP 202. The comparator 210 monitors the charging of the buffer capacitor 214 to determine whether a threshold has been reached. In some embodiments of the monitoring, the comparator 210 may compare a voltage across the buffer capacitor 214 with a reference voltage VREF 208. In response to the comparator 210 determining that the voltage across the buffer capacitor 214 has reached the level of the reference voltage VREF 208, then the comparator 210 determines that the threshold has been reached and that buffer capacitor 214 has reached a threshold amount of charge. The threshold amount of charge may correspond to an amount of charge sufficient for driving the gate of the driven switch 204 such that the charge from the buffer capacitor 214 and energy from the power source VSUP 202 can safely turn on the driven switch 204 fast enough that the driven switch 204 is not damaged.

During operation 410 of method 400, the comparator 210 closes the first switch S1 206 to initiate a charge redistribution of charge from the buffer capacitor 214 to the gate of the driven switch 204. The comparator closes the first switch S1 206 in order to connect the buffer capacitor 214 to the gate of the driven switch 204 and to initiate the charge redistribution based upon the comparator determine that the threshold has been reached where the voltage across the buffer capacitor 214 has reached the level of the reference voltage VREF 208. In this way, the buffer capacitor 214 transfers charge to the driven switch 204 and the power source VSUP 202 transfers energy to the driven switch 204 in order to turn on the driven switch.

After a delay 218 from initiating the charge redistribution, the comparator 210 opens the second switch 222 in order to disconnect the buffer capacitor 214 from the power source VSUP 202. In some embodiments, the delay 218 corresponds to a timeframe for the charge redistribution to charge an equivalent gate capacitance of the gate of the driven switch 204 (or a control terminal of a thyristor) for operating the driven switch 204 such as to safely turn on the driven switch 204 fast enough that the driven switch 204 is not damaged. Opening the second switch 222 disconnects the buffer capacitor 214 from the power source VSUP 202 so that the power source VSUP 202 does not needlessly charge the buffer capacitor 214 and the buffer capacitor 214 can more quickly settle to a final charge value.

An embodiment of the presently disclosed techniques comprises an apparatus. The apparatus comprises a power source; a first switch connected between a buffer capacitor and a driven switch; the buffer capacitor connected to and charged by the power source when the first switch is turned off; and a comparator to: monitor the charging of the buffer capacitor; and in response to the buffer capacitor reaching a threshold amount of charge, turning on the first switch to initiate a charge redistribution of charge from the buffer capacitor to the driven switch.

According to some embodiments, the charge redistribution transfers the charge from the buffer capacitor to an equivalent gate capacitance of a gate of the driven switch for operating the driven switch.

According to some embodiments, the driven switch comprises a thyristor, and wherein the charge redistribution transfers charge current to a control terminal of the thyristor to control the thyristor.

According to some embodiments, the apparatus comprises a second switch to operably connect and disconnect the buffer capacitor from the power source, wherein the comparator turns off the second switch after a delay from a point in time when the first switch is turned on to initiate the charge redistribution.

According to some embodiments, the delay corresponds to a timeframe for the charge redistribution to charge an equivalent gate capacitance of a gate of the driven switch for operating the driven switch.

According to some embodiments, the second switch disconnects the buffer capacitor from the power source in response to the comparator turning the second switch off after the charge redistribution has settled.

According to some embodiments, the second switch connects the buffer capacitor to the power source for charging the buffer capacitor in response to the comparator turning the second switch on.

According to some embodiments, the apparatus comprises a second switch to operably connect and disconnect the buffer capacitor from the power source, wherein the comparator turns on the second switch before the charge redistribution and turn off the second switch after a delay from initiating the charge redistribution.

According to some embodiments, the comparator includes hysteresis functionality or is connected to a latch.

An embodiment of the presently disclosed techniques comprises an apparatus. The apparatus comprises a first switch connected between a buffer capacitor and a driven switch, wherein the buffer capacitor is charged by a power source when the first switch is turned off; a second switch to operably connect and disconnect the buffer capacitor from the power source; and a comparator to: monitor the charging of the buffer capacitor while the second switch is turned on and the first switch is turned off; and in response to the buffer capacitor reaching a threshold amount of charge, turn on the first switch to initiate a charge redistribution of charge from the buffer capacitor to the driven switch.

According to some embodiments, the comparator turns the second switch on and the first switch off to enable the power source to charge the buffer capacitor.

According to some embodiments, the comparator turns the second switch off after a delay from a point in time when the first switch is turned on to initiate the charge redistribution.

According to some embodiments, the apparatus comprises a first current steering switch and a second current steering switch to steer current in a first direction to turn on the first switch.

According to some embodiments, the first current steering switch and the second current steering switch steer the current in a second direction to turn on the second switch.

According to some embodiments, the apparatus comprises a first current steering switch and a second current steering switch to steer current in a first direction to turn on the first switch and a second direction to turn on the second switch.

According to some embodiments, the comparator compares a voltage to a reference to determine whether to turn on or off the first current steering switch and the second current steering switch for steering the current in the first direction or the second direction.

According to some embodiments, the comparator operates the first current steering switch and the second current steering switch to turn on the first switch during a first timespan; and operates the first current steering switch and the second current steering switch to turn off the second switch during a second timespan longer than the first timespan.

An embodiment of the presently disclosed techniques comprises a method. The method comprises opening a first switch connecting a buffer capacitor to the driven switch; closing a second switch connecting the buffer capacitor to a power source; turning on the power source to charge the buffer capacitor while the first switch is open and the second switch is closed; monitoring, by a comparator, the charging of the buffer capacitor to determine whether a threshold has been reached; and in response to the threshold being reached, closing the first switch to initiate a charge redistribution of charge from the buffer capacitor to the driven switch.

According to some embodiments, the method comprises opening the second switch after a delay from initiating the charge redistribution.

According to some embodiments, the method comprises operating a first current steering switch and a second current steering switch to close the first switch during a first timespan; and operating the first current steering switch and the second current steering switch to open the second switch during a second timespan longer than the first timespan.

An embodiment of the presently disclosed techniques comprises an apparatus, comprising a means for opening a first switch connecting a buffer capacitor to the driven switch; a means for closing a second switch connecting the buffer capacitor to a power source; a means for turning on the power source to charge the buffer capacitor while the first switch is open and the second switch is closed; a means for monitoring, by a comparator, the charging of the buffer capacitor to determine whether a threshold has been reached; and a means for in response to the threshold being reached, closing the first switch to initiate a charge redistribution of charge from the buffer capacitor to the driven switch.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An apparatus, comprising:
a power source;
a first switch connected between a buffer capacitor and a driven switch, wherein the first switch is connected between an input of a comparator and a gate of the driven switch;
the buffer capacitor connected to and charged by the power source when the first switch is turned off; and
the comparator to:
monitor the charging of the buffer capacitor;
in response to the buffer capacitor reaching a threshold amount of charge, turning on the first switch to initiate a charge redistribution of charge from the buffer capacitor to the driven switch; and
control at least one of a first current steering switch or a second current steering switch that steer current in a first direction to turn on the first switch.

2. The apparatus of claim 1, wherein the charge redistribution transfers the charge from the buffer capacitor to an equivalent gate capacitance of the gate of the driven switch for operating the driven switch.

3. The apparatus of claim 1, wherein the driven switch comprises a thyristor, and wherein the charge redistribution transfers charge current to a control terminal of the thyristor to control the thyristor.

4. The apparatus of claim 1, comprising a second switch to operably connect and disconnect the buffer capacitor from the power source, wherein the comparator turns off the second switch after a delay from a point in time when the first switch is turned on to initiate the charge redistribution.

5. The apparatus of claim 4, wherein the delay corresponds to a timeframe for the charge redistribution to charge an equivalent gate capacitance of the gate of the driven switch for operating the driven switch.

6. The apparatus of claim 4, wherein the second switch disconnects the buffer capacitor from the power source in response to the comparator turning the second switch off after the charge redistribution has settled.

7. The apparatus of claim 4, wherein the second switch connects the buffer capacitor to the power source for charging the buffer capacitor in response to the comparator turning the second switch on.

8. The apparatus of claim 1, comprising a second switch to operably connect and disconnect the buffer capacitor from the power source, wherein the comparator turns on the second switch before the charge redistribution and turn off the second switch after a delay from initiating the charge redistribution.

9. The apparatus of claim 1, wherein the comparator includes hysteresis functionality or is connected to a latch.

10. An apparatus, comprising:
a first switch connected between a buffer capacitor and a driven switch, wherein the buffer capacitor is charged by a power source when the first switch is turned off;
a second switch to operably connect and disconnect the buffer capacitor from the power source;
a comparator to:
monitor the charging of the buffer capacitor while the second switch is turned on and the first switch is turned off; and
in response to the buffer capacitor reaching a threshold amount of charge, turn on the first switch to initiate a charge redistribution of charge from the buffer capacitor to the driven switch; and
a first current steering switch and a second current steering switch to steer current in a first direction to turn on the first switch, wherein the comparator controls at least one of the first current steering switch or the second current steering switch.

11. The apparatus of claim 10, wherein the comparator turns the second switch on and the first switch off to enable the power source to charge the buffer capacitor.

12. The apparatus of claim 10, wherein the comparator turns the second switch off after a delay from a point in time when the first switch is turned on to initiate the charge redistribution.

13. The apparatus of claim 10, wherein the comparator controls the first current steering switch.

14. The apparatus of claim 10, wherein the first current steering switch and the second current steering switch steer the current in a second direction to turn on the second switch.

15. The apparatus of claim 10, wherein the comparator controls the second current steering switch.

16. The apparatus of claim 14, wherein the comparator compares a voltage to a reference to determine whether to turn on or off the first current steering switch and the second current steering switch for steering the current in the first direction or the second direction.

17. The apparatus of claim 14, wherein the comparator:
operates the first current steering switch and the second current steering switch to turn on the first switch during a first timespan; and
operates the first current steering switch and the second current steering switch to turn off the second switch during a second timespan longer than the first timespan.

18. A method for controlling a driven switch, comprising:
opening a first switch connecting a buffer capacitor to the driven switch;
closing a second switch connecting the buffer capacitor to a power source;
turning on the power source to charge the buffer capacitor while the first switch is open and the second switch is closed;

monitoring, by a comparator, the charging of the buffer capacitor to determine whether a threshold has been reached;

in response to the threshold being reached, closing the first switch to initiate a charge redistribution of charge from the buffer capacitor to the driven switch; and operating a first current steering switch and a second current steering switch to close the first switch during a first timespan; and operating, by the comparator, at least one of the first current steering switch or the second current steering switch to steer current in a first direction to turn on the first switch.

19. The method of claim 18, comprising:

opening the second switch after a delay from initiating the charge redistribution.

20. The method of claim 18, comprising:

operating the first current steering switch and the second current steering switch to open the second switch during a second timespan longer than the first timespan.

* * * * *